United States Patent
Iyama et al.

(10) Patent No.: US 10,512,861 B2
(45) Date of Patent: Dec. 24, 2019

(54) ELECTRET FIBER SHEET

(71) Applicant: Toray Industries, Inc., Tokyo (JP)

(72) Inventors: Yuji Iyama, Otsu (JP); Shingo Hayashi, Otsu (JP); Takuji Kobayashi, Otsu (JP)

(73) Assignee: Toray Industries, Inc., Tokyo (JP)

( * ) Notice: Subject to any disclaimer, the term of this patent is extended or adjusted under 35 U.S.C. 154(b) by 0 days.

(21) Appl. No.: 16/062,168

(22) PCT Filed: Nov. 14, 2016

(86) PCT No.: PCT/JP2016/083638
§ 371 (c)(1),
(2) Date: Jun. 14, 2018

(87) PCT Pub. No.: WO2017/110299
PCT Pub. Date: Jun. 29, 2017

(65) Prior Publication Data
US 2018/0369729 A1 Dec. 27, 2018

(30) Foreign Application Priority Data
Dec. 22, 2015 (JP) .................. 2015-249678

(51) Int. Cl.
| | |
|---|---|
| *B01D 53/02* | (2006.01) |
| *B01D 39/14* | (2006.01) |
| *D06M 10/00* | (2006.01) |
| *D04H 1/4291* | (2012.01) |
| *D04H 1/435* | (2012.01) |
| *D04H 1/56* | (2006.01) |
| *G01R 23/17* | (2006.01) |

(52) U.S. Cl.
CPC .......... *B01D 39/14* (2013.01); *D04H 1/4291* (2013.01); *D04H 1/435* (2013.01); *D04H 1/56* (2013.01);
(Continued)

(58) Field of Classification Search
CPC .... B01D 2239/0208; B01D 2239/0435; B01D 2239/10; B01D 2239/1233;
(Continued)

(56) References Cited

U.S. PATENT DOCUMENTS

| | | | |
|---|---|---|---|
| 6,119,691 A | * | 9/2000 | Angadjivand ....... D04H 1/4382 128/205.29 |
| 6,375,886 B1 | | 4/2002 | Angadjivand et al. |

(Continued)

FOREIGN PATENT DOCUMENTS

| | | |
|---|---|---|
| JP | 61-289177 A | 12/1986 |
| JP | 09-501604 A | 2/1997 |

(Continued)

OTHER PUBLICATIONS

Translation of JP2010-17703 A; Otsuka; Jan. 2010.*
Extended European Search Report dated Jul. 30, 2019 of counterpart European Application No. 16878195.3.

*Primary Examiner* — Christopher P Jones
(74) *Attorney, Agent, or Firm* — DLA Piper LLP (US)

(57) ABSTRACT

A fiber sheet is densely charged with electric charge and provides an electret fiber sheet that has excellent dust collecting performance. The electret fiber sheet is an electret fiber sheet in which averages of a* values and b* values satisfy all requirements of the following (a) to (c): (a) $10 \leq$ average of (a* values)$\leq 40$; (b) $-25 \leq$ average of (b* values)$\leq 0$; and (c) $-5 \leq$ average of [(a* values)+(b* values)] $\leq 40$; wherein a* and b* are values measured by a spectrophotometer when a red positive charge toner and a blue negative charge toner are attached.

2 Claims, 1 Drawing Sheet

(52) U.S. Cl.
CPC ..... *D06M 10/00* (2013.01); *B01D 2239/0435* (2013.01); *B01D 2239/0618* (2013.01); *B01D 2239/0622* (2013.01); *G01R 23/17* (2013.01)

(58) Field of Classification Search
CPC ........ B01D 2239/1291; B01D 2279/40; B01D 39/14; B01D 39/1623; B01D 46/0001; B01D 46/0032; B01D 46/10; B03C 3/47; B03C 3/60; D06M 10/00
See application file for complete search history.

(56) References Cited

U.S. PATENT DOCUMENTS

| | | | | |
|---|---|---|---|---|
| 2003/0207635 | A1* | 11/2003 | Minemura | B01D 39/1623 442/327 |
| 2006/0254419 | A1* | 11/2006 | Leonard | H01G 7/02 95/57 |
| 2007/0215008 | A1* | 9/2007 | Schweikart | C09B 67/0046 106/496 |
| 2014/0123854 | A1* | 5/2014 | Leonard | B03C 3/30 96/28 |
| 2016/0175753 | A1* | 6/2016 | Hidaka | B03C 3/28 96/135 |
| 2017/0033276 | A1* | 2/2017 | Kou | G06F 3/041 |

FOREIGN PATENT DOCUMENTS

| | | | |
|---|---|---|---|
| JP | 2002-166114 | A | 6/2002 |
| JP | 2003-003367 | A | 1/2003 |
| JP | 2010-017703 | A | 1/2010 |
| WO | 2016/147866 | A1 | 9/2016 |

\* cited by examiner

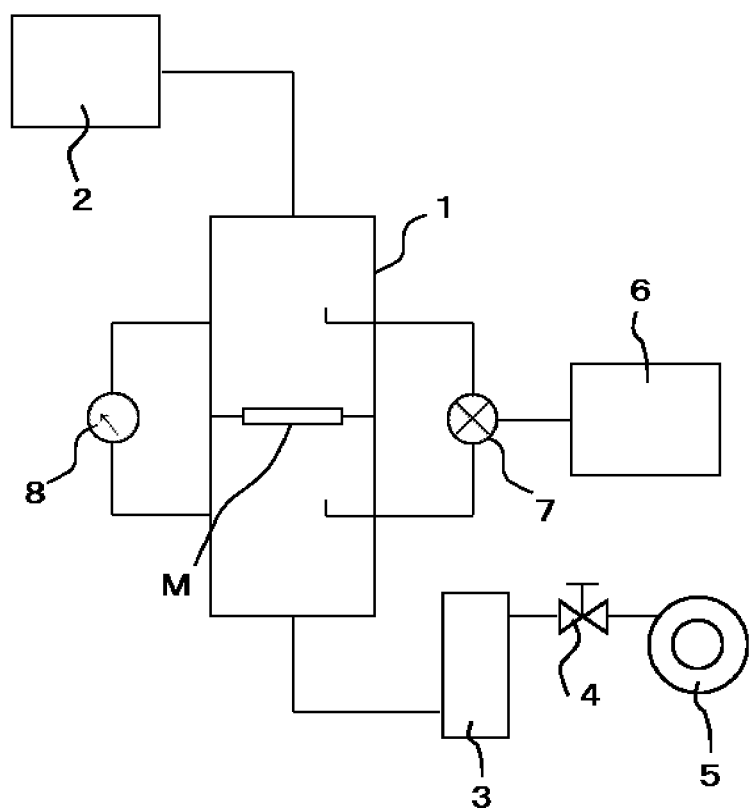

ELECTRET FIBER SHEET

TECHNICAL FIELD

This disclosure relates to electretized fiber sheets. More specifically, this disclosure relates to electret fiber sheets that achieve a charge distribution which is significantly different from one obtained by a conventional hydrocharging method and which is, in other words, a charge distribution having negative polarity charge unevenly distributed to be denser toward the surface in the fiber sheet, and that have excellent dust collecting performance.

BACKGROUND

Air filters are conventionally used to remove pollen, dust, and the like from the air, and nonwoven fabrics are often used as filter media for air filters. Among others, a melt-blowing process, which is one of the methods of producing nonwoven fabrics, is widely used to produce filter media of air filter products, battery separators and the like. A melt-blowing process is generally a process in which hot air is blown over a thermoplastic polymer extruded from a spinneret, whereby the polymer is formed into fine fibers, and the obtained fibers have self-fusing characteristics utilized to form the fibers into a fiber web. As compared to other production processes of nonwoven fabrics such as a spun-bonding process or the like, a melt-blowing process has the advantages of requiring no complicated steps and easily producing fine fibers having a diameter of tens of micrometers to several micrometers or less.

The performance required to air filters includes high collecting efficiency that enables collection of a large amount of micro dust and low pressure loss that is due to low resistance to airflow passing through an air filter. To provide a filter medium having high collecting efficiency, a nonwoven fabric composed of single fibers having a small fineness is suitable, but single fibers formed to have a small fineness are likely to cause such a nonwoven fabric to easily collapse and increase the fiber density, resulting in causing an increased pressure loss.

In addition, to provide a filter medium exhibiting low pressure loss, a nonwoven fabric composed of single fibers having a thick fineness is suitable, but single fibers formed to have a thick fineness reduce the fiber surface area of such a nonwoven fabric, resulting in decreasing the collecting efficiency. Thus, having high collecting efficiency is incompatible with having low pressure loss.

To solve the above problem, an attempt has been made to satisfy both high collecting efficiency and low pressure loss by electretizing a nonwoven fabric and utilizing not only the physical action but also the electrostatic action.

For example, a method of producing electret fiber sheets has been proposed, in which the method includes: keeping a nonwoven fabric in contact with a ground electrode; and applying a high voltage to the nonwoven fabric with a non-contact voltage applying electrode while moving the ground electrode and the nonwoven fabric together, thereby continuously electretizing the fabric (see JP 61-289177 A). This proposition is based on a corona discharge method, in which a nonwoven fabric undergoes an injection of electrons, transfer of ions, orientation of dipoles, and the like in the fabric, whereby the nonwoven fabric is polarized and electrically charged. However, such a corona discharge method is a production method in which mainly only the surface of a fiber sheet is electrically charged and leaves it difficult to charge the inside with electric charge and, therefore, it is difficult to say that the method achieves sufficient electretization.

In view of this, as electretization methods of solving such a problem, methods in which electrically charging a fiber by subjecting it to water contact have been proposed. Specifically, proposed are: a method in which a fiber sheet is electretized by spraying water on the sheet using a water spout or water jet at a pressure sufficient for the water to permeate into the nonwoven fabric such that the fiber sheet has positive polarity charge and negative polarity charge evenly mixed (see U.S. Pat. No. 6,119,691 A); and a so-called hydrocharging method such as a method in which a fiber sheet is passed over a nozzle having a slit shape while the nozzle sucks water to thereby allow the water to permeate into the fiber sheet, such that the fiber sheet has positive polarity charge and negative polarity charge evenly mixed (see JP 2003-3367 A).

A fiber sheet obtained by the hydrocharging method can be electrically charged throughout the fiber sheet because even the fiber in the inside of the fiber sheet is subjected to water contact. Under the current circumstances, however, a fiber sheet cannot be densely charged with positive polarity charge and negative polarity charge even by using the hydrocharging method.

It could therefore be helpful to provide an electret fiber sheet formed by densely charging a fiber sheet with electric charge and having excellent dust collecting performance.

SUMMARY

We found that a fiber sheet obtained by a conventional hydrocharging method has positive polarity charge and negative polarity charge evenly mixed in the surface of the fiber sheet is likely to cause neutralization to the electric charges, and fails to charge the fiber sheet with dense electric charge.

We thus provide:
An electret fiber sheet in which averages of a* values and b* values satisfy (a) to (c):

$$10 \leq \text{average of } (a^* \text{ values}) \leq 40; \quad (a)$$

$$-25 \leq \text{average of } (b^* \text{ values}) \leq 0; \text{ and} \quad (b)$$

$$-5 \leq \text{average of } [(a^* \text{ values}) + (b^* \text{ values})] \leq 40, \quad (c)$$

wherein a* and b* are values measured by a spectrophotometer when a red positive charge toner and a blue negative charge toner are attached.

A preferred electret fiber sheet is an electret fiber sheet in which a* values and b* values satisfy (d) to (f):

$$5 \leq a^* \text{ value} \leq 50; \quad (d)$$

$$-30 \leq b^* \text{ value} \leq 5; \text{ and} \quad (e)$$

$$-10 \leq (a^* \text{ value}) + (b^* \text{ value}) \leq 50, \quad (f)$$

wherein a* and b* are values measured by a spectrophotometer when the red positive charge toner and the blue negative charge toner are attached.

We provide electret fiber sheets that achieve a charge distribution significantly different from one obtained by conventional hydrocharging methods, in other words, a charge distribution having negative polarity charge unevenly distributed to be denser toward the surface in the fiber sheet, and that have excellent dust collecting performance. In particular, the electret fiber sheet exhibits excellent collecting performance against positively charged dust.

BRIEF DESCRIPTION OF THE DRAWINGS

FIG. 1 is a schematic side view illustrating a measurement device for measuring collecting efficiency and pressure loss.

REFERENCE SIGNS LIST

1: Sample holder
2: Dust storing box
3: Flow meter
4: Flow control valve
5: Blower
6: Particle counter
7: Switch cock
8: Pressure gauge
M: Measurement sample

DETAILED DESCRIPTION

The electret fiber sheet is an electret fiber sheet in which averages of a* values and b* values satisfy (a) to (c):

$$10 \leq \text{average of } (a^* \text{ values}) \leq 40; \quad (a)$$

$$-25 \leq \text{average of } (b^* \text{ values}) \leq 0; \text{ and} \quad (b)$$

$$-5 \leq \text{average of } [(a^* \text{ values}) + (b^* \text{ values})] \leq 40, \quad (c)$$

wherein a* and b* are values measured by a spectrophotometer when a red positive charge toner and a blue negative charge toner are attached.

As used herein, an a* value and a b* value refer to the a* value and the b* value in the "L*a*b* colorimetric system" standardized by International Commission on Illumination (CIE).

The details will be described below about using the toners to visualize a charge distribution in the electret fiber sheet.

The electret fiber sheet is a fiber sheet made of a fiber material having non-conductivity. Examples of such electret fiber sheets include those fabrics, knitting, and nonwoven fabrics and the like made of synthetic fiber. For air filters, in particular nonwoven fabrics composed of synthetic fiber are preferable, and, among others, melt blown fiber nonwoven fabrics are preferably used.

The non-conductivity as mentioned herein is an aspect in which volume resistivity is preferably $10^{12}$·Ω·cm or more, more preferably $10^{14}$·Ω·cm or more.

Examples of fiber materials of such an electret fiber sheet include: polyolefin resins such as polyethylene and polypropylene; polyester resins such as polyethylene terephthalate, polytrimethylene terephthalate, polybutyrene terephthalate, and polylactic acid; polycarbonate resins; polystyrene resins; polyphenylene sulfide resins; fluorine resins; elastomers such as polystyrene elastomer, polyolefin elastomer, polyester elastomer, polyamide elastomer, and polyurethane elastomer; copolymers or mixtures thereof and the like.

Among these, fiber materials mainly containing a polyolefin resin are preferably used. Because polyolefin resins have high volume resistivity and low water absorption, they exhibit a strong charging property and charge retention property when formed into a fiber and, accordingly, these effects achieve high collecting efficiency.

Examples of polyolefin resins include homopolymers such as polyethylene, polypropylene, polybutene, and polymethylpentene. In addition, copolymers in which such a homopolymer is copolymerized with a different component, or polymer blends of two or more different polymers can be used. Among these, polypropylene and polymethylpentene are preferably used from the viewpoint of charge retention. In addition, polypropylene is further preferably used because it is available at low cost.

In a preferred fiber sheet composed of a non-conductive fiber material, at least one from among hindered amine additives and/or triazine additives is blended in the fiber material from the viewpoint of enhancing weather resistance and improving electret performance.

Among the above-described two kinds of additives, examples of hindered amine compounds include poly[(6-(1,1,3,3-tetramethylbutyl)imino-1,3,5-triazine-2,4-diyl)((2,2,6,6-tetramethyl-4-piperidyl)imino)hexamethylene((2,2,6,6-tetramethyl-4-piperidyl)imino)] ("CHIMASSORB" (registered trademark) 944LD, manufactured by BASF Japan Ltd.), a poly-condensate of dimethyl succinate with 1-(2-hydroxyethyl)-4-hydroxy-2,2,6,6-tetrameth-ylpiperidine ("TINUVIN" (registered trademark) 622LD, manufactured by BASF Japan Ltd.), bis(1,2,2,6,6-pentamethyl-4-piperidyl)-2-(3,5-di-t-butyl-4-hydroxybenzyl)-2-n-butylmalonate ("TINUVIN" (registered trademark) 144, manufactured by BASF Japan Ltd.), and the like.

In addition, examples of triazine additives include poly [(6-(1,1,3,3-tetramethylbut-yl)imino-1,3,5-triazine-2,4-diyl) ((2,2,6,6-tetramethyl-4-piperidyl)imino)hexamethylene((2,2,6,6-tetra methyl-4-piperidyl)imino)] ("CHIMASSORB" (registered trademark) 944LD, manufactured by BASF Japan Ltd.), 2-(4,6-diphenyl-1,3,5-triazine-2-yl)-5-((hexyl) oxy)-phenol ("TINUVIN" (registered trademark) 1577FF, manufactured by BASF Japan Ltd.) and the like.

Among these, hindered amine additives are preferably used, and in particular poly[(6-(1,1,3,3-tetramethylbutyl) imino-1,3,5-triazine-2,4-diyl) ((2,2,6,6-tetramethyl-4-piperidyl)imino) hexamethylene((2,2,6,6-tetramethyl-4-piperidyl)imino)] ("CHIMASSORB" (registered trademark) 944LD, manufactured by BASF Japan Ltd.) is preferably used.

The addition amount of the above-described hindered amine additive or triazine additive is preferably 0.5 to 5 mass %, more preferably 0.7 to 3 mass %. The addition amounts in these ranges can afford excellent dust collecting performance to electretized fiber sheets.

Other than the above-described additives, those additives such as heat stabilizers, weathering agents, and polymerization inhibitors generally used for non-conductive fiber sheets of electretized products can be added to non-conductive electret fiber sheets.

Preferably, an electretizing method used in the production of the electret fiber sheet is carried out by impinging, on a non-conductive fiber sheet, a specific water amount or less of water spray or water jet spouted from a nozzle, as described below. When a non-conductive fiber sheet is processed by a common hydrocharging method, the fiber sheet exhibits a charge distribution having positive polarity charge and negative polarity charge evenly mixed as in a conventional technology, whereas the impingement of water spray or water jet spouted from a nozzle at a specific water amount or less can achieve a charge distribution having more negative polarity charge unevenly distributed toward the surface in the non-conductive fiber sheet. It is possible that the adoption of such a method causes the polarity of expressed charge to vary with the water amount of a water spray or a water jet, although it is unclear why the negative polarity charge is unevenly distributed.

The details of the method of producing the electret fiber sheet will be described below.

A charge distribution in the electret fiber sheet is visualized by attaching a red positive charge toner and a blue negative charge toner to the electret fiber sheet. A method of attaching a red positive charge toner and a blue negative charge toner to an electret fiber sheet is carried out through the procedures based on (1) to (5). This series of procedures is preferably carried out in an environment having a humidity of 50% or less.

(1) Powder toner (purple color) is made by mixing amounts of the following red positive charge toner and blue negative charge toner used for color copying machines:

red toner: IKT-821-2M (available from IKK Trading Co., Ltd.)

blue toner: ART CYAN TONER (available from IMEX Co., Ltd.).

(2) The prepared powder toner is placed on a plain-weave metal gauze having a mesh size of 100, and the plain-weave metal gauze is vibrated above an electret fiber sheet so that the powder toner can be sprinkled over the electret fiber sheet until the body of the fiber sheet becomes invisible. In this case, there should not be any action such as pressing or rubbing the toner against the fiber sheet by giving pressure with a hand or an object (such as an iron plate).

(3) A corner of the electret fiber sheet is lifted and shaken up and down about 20 times to drop remaining excess powder toner.

(4) The procedures of the above-described (2) and (3) are repeated three times in total.

(5) The electret fiber sheet is set on a laminating pouch film (part number FCP10216303 (available from Fujipla Inc.)), and they are adhered together using a pouch laminater (part number DS320P (manufactured by GBC Japan K.K.)) with the output dial set at 1.

A charge distribution carried out with toners using the above-described method corresponds to the electric charge that the electret fiber sheet has so that when the fiber has negative polarity charge, red toner is attached to the fiber sheet, and when the fiber has positive polarity charge, blue toner is attached to the fiber sheet. In addition, the larger the amount of electric charge is, the more toner corresponding to the polarity of the charge is attached, and the thicker the color shade is.

For the electret fiber sheet to which a red positive charge toner and a blue negative charge toner are attached, it is important that averages of a* values and b* values measured by a spectrophotometer satisfy (a) to (c):

$$10 \leq \text{average of } (a^* \text{ values}) \leq 40; \quad (a)$$

$$-25 \leq \text{average of } (b^* \text{ values}) \leq 0; \text{ and} \quad (b)$$

$$-5 \leq \text{average of } [(a^* \text{ values})+(b^* \text{ values})] \leq 40. \quad (c)$$

An average of a* values is more preferably 15 to 40, an average of b* values is more preferably −20 to 0, and an average of (a* values)+(b* values) is more preferably −5 to 30, when the electret fiber sheet to which a red positive charge toner and a blue negative charge toner are attached are measured for a* and b* by a spectrophotometer. By having these values for the characteristic values obtained from a* values and b* values, the electret fiber sheet has negative polarity charge unevenly distributed to be denser toward the surface in the electret fiber sheet and can obtain excellent dust collecting performance.

Further preferably, a* values and b* values satisfy (d) to (f) as above-mentioned at any point on the electret fiber sheet, in which a* and b* are measured by a spectrophotometer when the red positive charge toner and the blue negative charge toner are attached:

$$5 \leq a^* \text{ value} \leq 50; \quad (d)$$

$$-30 \leq b^* \text{ value} \leq 5; \text{ and} \quad (e)$$

$$-10 \leq (a^* \text{ value})+(b^* \text{ value}) \leq 50. \quad (f)$$

a* values are preferably 10 to 40, b* values are preferably −25 to 0, and (a* values)+(b* values) is preferably −5 to 40, when the electret fiber sheet to which a red positive charge toner and a blue negative charge toner are attached are measured for a* and b* by a spectrophotometer. By having these values for the characteristic values obtained from a* values and b* values, the fiber sheet has negative polarity charge unevenly distributed to be denser toward the surface in the fiber sheet and can obtain excellent dust collecting performance.

A fiber constituting the electret fiber sheet preferably has an average diameter of single fiber 0.1 to 8.0 μm. By having an average diameter of single fiber of preferably 0.1 to 8.0 more preferably 0.3 to 7.0 μm, further preferably 0.5 to 5.0 μm, electret fiber sheets having excellent breathability and dust collecting performance can be obtained.

In addition, the electret fiber sheet preferably has a mass-per-unit-area 3 to 100 g/m². By having a mass-per-unit-area of 3 to 100 g/m², preferably 5 to 70 g/m², more preferably 10 to 50 g/m², electret fiber sheets having excellent breathability and dust collecting performance can be obtained.

Next, a method of producing the electret fiber sheet will be described.

An electretizing method includes: a spraying step of impinging of water spray or water jet on a non-conductive fiber sheet at a specific water amount or less; a dehydrating step; and a drying step.

Water used as water spray or water jet used in the spraying step is preferably water that has been rid of dirt with a liquid filter and the like and that is as clean as possible. In particular, pure water such as ion-exchanged water, distilled water, and filtrate water that has passed through a reverse osmosis membrane is preferably used. In addition, the level of pure water is preferably $10^3$ μS/m or less, further preferably $10^2$ μS/m or less, in terms of conductivity. In addition, the above-described water can be mixed with a water-soluble organic solvent to the extent that the collecting characteristics of the fiber sheet is not adversely affected.

For those nozzles that spout a water spray or a water jet, nozzles of various shapes such as a circle, a hollow circle, and an ellipse or two-fluid slit nozzles which spout air and water simultaneously can be applied. In addition, rectangular two-fluid slit nozzles are more preferably used in that they spout a water spray or a water jet evenly in the width direction of the fiber sheet.

When a two-fluid slit nozzle is used, its slit width can be changed to adjust the water spray pressure, the air spray pressure, and the flow rates thereof. For example, a narrowed slit width enables the spray pressure to be increased at the same flow rate.

On the other hand, the use of a water jet punch nozzle causes water to be spouted in the shape of a continuous column and thus is likely to damage the fiber, and the continuous columnar stream makes it more difficult for the water to be microdispersed when impinged on the fiber sheet.

To impart electric charge to a non-conductive fiber sheet, the spouting pressure is preferably a pressure that can impart water to the fiber sheet when the water is impinged on the fiber sheet. The pressure is preferably 0.1 to 4.0 MPa, more preferably 0.1 to 3.0 MPa. A spouting pressure of higher than 4.0 MPa may cause a larger damage, fuzzing, and the like to the fiber sheet and generate more irregularity on the sheet.

Further, when a two-fluid nozzle is used, the air pressure and the water pressure are preferably the same. It is possible that, when either the air pressure or the water pressure is high, it is difficult to spout water evenly to the fiber sheet, which thus develops a reduced amount of electric charge or has a variable charge distribution, failing to obtain high collecting efficiency.

The spouting water amount of a water spray or a water jet is preferably 1 to 15 L/min per one-meter-width, more preferably 3 to 12 L/min. It is possible that, when the water amount of a water spray or a water jet is less than 1 L/min/m, the contact between the fiber sheet and water is insufficient, and thus the amount of electric charge is reduced, resulting in failing to afford high collecting efficiency. In contrast, it is possible that, when the water amount of a water spray or a water jet is more than 15 L/min/m, positive polarity charge and negative polarity charge are evenly mixed, or positive polarity charge is unevenly distributed densely, resulting in failing to afford high collecting efficiency.

In addition, the distance between the nozzle spouting face and the fiber sheet surface is preferably 3 to 50 cm, more preferably 5 to 30 cm. A distance of 3 cm or less between the nozzle spouting face and the fiber sheet surface is likely to cause a larger damage, fuzzing, and the like to the fiber sheet. In addition, it is possible that, when the distance between the nozzle spouting face and the fiber sheet surface is 50 cm or more, water spouted from the nozzle spreads widely, the efficiency of imparting water to the fiber sheet is reduced, the impingement pressure of a water spray or a water jet to the fiber sheet is reduced, and thus the water does not contact the fiber inside the fiber sheet, resulting in failing to afford sufficient collecting efficiency.

Further, it is preferable that an iron plate, a fine-meshed metal gauze or the like be placed under the fiber sheet to help to microdisperse water and to infiltrate water into the fiber sheet when the nozzle spouts the water against the fiber sheet.

Preferably, a non-conductive fiber sheet undergoes a dehydrating step for dehydration treatment after a water spray or a water jet is spouted against the sheet. A dehydrating means can be carried out by, for example, nip rolling, using water absorbent rolls, sucking with a suction nozzle, and the like. The dehydration is useful because it can enhance drying efficiency in the subsequent drying step.

Any conventionally known drying method can be used as a drying method in the drying step. For example, hot-air drying, vacuum drying, air-drying and the like can be applied. Among others, hot-air drying is a preferred aspect because it enables continuous treatment. When a hot-air drying method is adopted, the drying temperature needs to be such a temperature as not to deactivate an electret.

The non-conductive electret fiber sheet is preferably dried until the moisture included in the non-conductive electret fiber sheet reaches a standard moisture regain. In addition, the drying temperature is preferably 130° C. or less, more preferably 120° C. or less, further preferably 110° C. or less. The electret fiber sheet is preferably discharged from a drier immediately after drying so that its electret effect cannot be deactivated, and, for example, in a preferred aspect, the fiber sheet is discharged within 20 minutes when the drying temperature is 110° C. or more.

The electret fiber sheet can be preferably used as a filter medium for filters. The filter medium is suitable for air filters in general and is especially suitable for high-performance applications such as filters for air conditioners, filters for air cleaners, and automotive cabin filters, but the range of application of the filter medium is not limited thereto.

EXAMPLES (1) Average Diameter of Single Fiber

For an average diameter of single fiber, 10 measurement samples each 3 mm×3 mm were cut out of an arbitrary area of a nonwoven fabric, the fiber surfaces of the samples were observed with a scanning electron microscope adjusted at a magnification of 1000 to 3000×, and one photograph was taken for each of the samples taken for measurement (10 photographs in total). The fibers whose diameters were clearly observed in the photographs were measured down to the 0.01 µm level as a significant figure, and the averaged value was taken as an average diameter of a single fiber.

(2) a* Value, b* Value, and a* Value+b* Value

Using the above-described method, samples with toners attached thereto (having a size of 8 cm in length×25 cm in width) were made, a 20 cm width in the center of each sample was continuously measured for a* and b* at 5 mm intervals in the width direction using a spectrophotometer (Spectrophotometer CM3700D (manufactured by Minolta Co., Ltd.)). The minimum and maximum value of a* value and b* value were calculated from the measured data of 25 values, and further, the respective averages of a* values and b* values were calculated from the data of 25 values. In addition, an a* value+b* value at each measured point was determined from the a* value and the b* value at the measured point, and further, the minimum, maximum, and average of a* value+b* value were calculated from the data of 25 values. The measurement conditions for spectrophotometry are as follows:

Measurement Conditions for Spectrophotometry
  field of view: 10°
  light source: D65
  measurement: reflection
  specular component treatment: SCE
  measurement area diameter: SAV (3 mm×5 mm)
  UV conditions: 100% FULL (3) Collecting Performance (Collecting Efficiency)

From five places in the width direction of a nonwoven fabric, measurement samples each 15 cm in length×15 cm in width were cut out, and the collecting efficiency of each sample was measured with the collecting efficiency measurement device shown in FIG. 1. The collecting efficiency measurement device includes a sample holder 1 to hold a measurement sample M, the upstream of the sample holder 1 is connected to a dust storing box 2, and the downstream of the sample holder 1 is connected to a flow meter 3, a flow control valve 4, and a blower 5. The sample holder 1 is equipped with a particle counter 6 and the number of dust particles can be counted at each of the upstream and downstream sides of the measurement sample M by operating a switch cock 7. The sample holder 1 is also equipped with a pressure gauge 8, which can indicate the static pressure difference between the upstream side and the downstream side of the measurement sample M.

The collecting efficiency were determined as follows: a 10% polystyrene 0.309U solution (manufactured by Nacalai Tesque, Inc.) was diluted 200-fold with distilled water and placed in the dust storing box 2. Next, the measurement sample M was placed in the sample holder 1. Airflow was adjusted with the flow control valve 4 so that the air passed through the filter at a velocity of 4.5 m/minute. The dust concentration was maintained at 10,000 to 40,000 particles/ $2.83 \times 10^{-4}$ m$^3$ (0.01 ft$^3$). The number of dust particles at the upstream side (D) and the number of dust particles at the downstream side (d) were measured for the measurement sample M using the particle counter 6 (KC-01D manufactured by RION Co., Ltd.). The measurement was repeated three times for each sample. The collecting efficiency (%) for particles having a diameter of 0.3 to 0.5 µm was calculated using the following expression based on JIS K 0901(1991) "Form, size and performance testing methods of filtration media for collecting airborne particulate matters." The average value from the three measurement samples was taken as a final collecting efficiency result.

Collecting Efficiency (%)=[1−(d/D)]×100 wherein d is the total of the numbers of dust particles at the downstream side in three measurements, and D is the total of the numbers of dust particles at the upstream side in three measurements.

Example 1

A melt blown nonwoven fabric having a mass-per-unit-area area of 25 g/m$^2$ and an average fiber diameter of 2.0 µm was produced by a melt blown method using as a raw material a polypropylene that has a melt flow rate of 800 g/10 minutes and contains 1 mass % hindered amine compound "CHIMAS SORB" (registered trademark) 944 (manufactured by BASF Japan Ltd.) as a weathering agent. Subsequently, a two-fluid slit nozzle (manufactured by Spraying Systems Co., Japan, and having a slit length of 600 mm and a slit width of 0.07 mm) was disposed such that there was a distance of 20 cm between the spouting face and the fiber sheet surface, and a pure water spray was impinged on the melt blown nonwoven fabric, which was kept running, in a spray water amount of 10 L/min/m at an air spray pressure of 0.1 MPa and a water spray pressure of 0.1 MPa. Then, the melt blown nonwoven fabric was dewatered and then dried with hot air at a temperature of 100° C. for one minute to thereby afford an electretized melt blown nonwoven fabric. The resulting electret melt blown nonwoven fabric was measured for collecting performance, and the fabric having toners attached thereto was measured for a* values and b* values. The characteristic values and collecting efficiency obtained from the a* values and the b* values are shown in Table 1.

Example 2

An electretized melt blown nonwoven fabric was made under the same conditions as in Example 1 except that the distance between the spouting face and the fiber sheet surface was 30 cm. The resulting electret melt blown nonwoven fabric was measured for each characteristic value in the same manner as in Example 1. The results are shown in Table 1.

Example 3

An electretized melt blown nonwoven fabric was made under the same conditions as in Example 1 except that a melt blown nonwoven fabric having a mass-per-unit-area of 40 g/m$^2$ and an average fiber diameter of 3.5 µm was used. The resulting electret melt blown nonwoven fabric was measured for each characteristic value in the same manner as in Example 1. The results are shown in Table 1.

Example 4

An electretized melt blown nonwoven fabric was made under the same conditions as in Example 3 except that a two-fluid slit nozzle having a slit width of 0.06 mm was used, the distance between the spouting face and the fiber sheet surface was 5 cm, the spray water amount was 5 L/min/m, the water spray pressure was 0.2 MPa, and the air spray pressure was 0.2 MPa. The resulting electret melt blown nonwoven fabric was measured for each characteristic value in the same manner as in Example 1. The results are shown in Table 1.

Comparative Example 1

Using a device in which nozzles (model number B1/8 GG-SS-1, manufactured by Spraying Systems Co., Japan) having a spraying angle of 50° (when at a pressure of 0.6 MPa) and adapted to give a circular spray were disposed at 40 mm spacings in a zigzag pattern and which was installed such that there was a distance of 4 cm between the spouting face and the fiber sheet surface, a pure water spray from each nozzle was impinged on the melt blown nonwoven fabric made in Example 1, which was kept running, in a spray water amount of 33 L/min/m and at an air spray pressure of 1.0 MPa. Then, the melt blown nonwoven fabric was dewatered and dried with hot air at a temperature of 100° C. for one minute to thereby afford an electretized melt blown nonwoven fabric. The resulting electret melt blown nonwoven fabric was measured for each characteristic value in the same manner as in Example 1. The results are shown in Table 2.

Comparative Example 2

An electretized melt blown nonwoven fabric was obtained in the same manner as in Comparative Example 1 except that the distance between the spouting face and the fiber sheet surface was 6 cm, the air spray pressure was 4.0 MPa, the spray water amount was 65 L/min/m, and a pure water spray from each nozzle was impinged on the sheet, which was then passed through misty water generated by the water spout. The resulting electret melt blown nonwoven fabric was measured for each characteristic value in the same manner as in Example 1. The results are shown in Table 2.

Comparative Example 3

An electretized melt blown nonwoven fabric was obtained in the same manner as in Example 2 except that the air spray pressure was 0.25 MPa, the water spray pressure was 0.25 MP, the spray water amount was 17 L/min/m. The resulting electret melt blown nonwoven fabric was measured for each characteristic value in the same manner as in Example 1. The results are shown in Table 2.

Comparative Example 4

An electretized melt blown nonwoven fabric was obtained in the same manner as in Example 3 except that the air spray pressure was 0.25 MPa, the water spray pressure was 0.25 MPa, the spray water amount was 17 L/min/m. The resulting electret melt blown nonwoven fabric was measured for each characteristic value in the same manner as in Example 1. The results are shown in Table 2.

Comparative Example 5

The melt blown nonwoven fabric produced in Example 1 was run on the surface of pure water supplied in a water tank while a slit-shaped suction nozzle in contact with the surface of the web was sucking the water, whereby the water permeated through the whole area of the fiber sheet, and the web was dewatered, and then dried with hot air at a temperature of 100° C. for 1 minutes to thereby afford an electretized melt blown nonwoven fabric. The resulting electret melt blown nonwoven fabric was measured for each characteristic value in the same manner as in Example 1. The results are shown in Table 2.

satisfy (a) to (c), compared to Examples 1 to 4 and, accordingly, the red toner and the blue toner in mixture were attached to the fiber sheet surface, or the blue toner was attached as to be unevenly distributed. Owing to this, positive polarity charge and negative polarity charge were mixed under the fiber sheet surface, or positive polarity charge was unevenly distributed densely there, with the result that the collecting efficiency was low.

TABLE 1

|  |  |  | Example 1 | Example 2 | Example 3 | Example 4 |
|---|---|---|---|---|---|---|
| Fiber Sheet | Raw Material | — | PP | PP | PP | PP |
|  | Production Method | — | Melt blown | Melt blown | Melt blown | Melt blown |
|  | Average Single Fiber Diameter | μm | 2.0 | 2.0 | 3.5 | 3.5 |
|  | Mass-Per-Unit-Area | g/m$^2$ | 25 | 25 | 40 | 40 |
| Electretizing Conditions | Nozzle Slit Width | mm | 0.07 | 0.07 | 0.07 | 0.06 |
|  | Spray Water Amount | L/min/m | 10 | 10 | 10 | 5 |
|  | Water Spray Pressure | MPa | 0.1 | 0.1 | 0.1 | 0.2 |
|  | Air Spray Pressure | MPa | 0.1 | 0.1 | 0.1 | 0.2 |
|  | Spraying Distance | cm | 20 | 30 | 20 | 5 |
| Fiber Sheet Characteristics | a* Value | Minimum | 15.2 | 13.3 | 11.4 | 9.0 |
|  |  | Maximum | 25.7 | 26.8 | 24.6 | 13.1 |
|  |  | Average | 20.7 | 19.4 | 16.2 | 11.0 |
|  | b* Value | Minimum | −19.6 | −18.6 | −20.7 | −15.6 |
|  |  | Maximum | −11.5 | −10.4 | −13.3 | −12.4 |
|  |  | Average | −14.0 | −14.8 | −18.5 | −13.7 |
|  | (a* Value) + (b* Value) | Minimum | −4.4 | −5.4 | −9.2 | −6.3 |
|  |  | Maximum | 14.3 | 16.4 | 11.4 | 0.8 |
|  |  | Average | 6.7 | 4.6 | −2.3 | −2.7 |
|  | Collecting Efficiency | % | 99.99 | 99.98 | 99.54 | 99.36 |

TABLE 2

|  |  |  | Comparative Example 1 | Comparative Example 2 | Comparative Example 3 | Comparative Example 4 | Comparative Example 5 |
|---|---|---|---|---|---|---|---|
| Fiber Sheet | Raw Material | — | PP | PP | PP | PP | PP |
|  | Production Method | — | Melt blown | Melt blown | Melt blown | Melt blown | Melt blown |
|  | Average Single Fiber Diameter | μm | 2.0 | 2.0 | 2.0 | 3.5 | 2.0 |
|  | Mass-Per-Unit-Area | g/m$^2$ | 25 | 25 | 25 | 40 | 25 |
| Electretizing Conditions | Nozzle Slit Width | mm | 0.07 | 0.07 | 0.07 | 0.07 | — (Suction Type) |
|  | Spray Water Amount | L/min/m | 33 | 65 | 17 | 17 | — (Suction Type) |
|  | Water Spray Pressure | MPa | 1.0 | 4.0 | 0.25 | 0.25 | — (Suction Type) |
|  | Air Spray Pressure | MPa | — (Single-fluid) | — (Single-fluid) | 0.25 | 0.25 | — (Suction Type) |
|  | Spraying Distance | cm | 4 | 6 | 30 | 20 | — (Suction Type) |
| Fiber Sheet Characteristics | a* Value | Minimum | 8.2 | 5.0 | 1.9 | 1.6 | 10.1 |
|  |  | Maximum | 19.6 | 11.7 | 16.6 | 16.7 | 17.7 |
|  |  | Average | 13.8 | 8.0 | 8.7 | 8.8 | 14.1 |
|  | b* Value | Minimum | −24.1 | −26.4 | −26.2 | −26.3 | −21.3 |
|  |  | Maximum | −15.5 | −21.8 | −16.7 | −17.0 | −14.4 |
|  |  | Average | −19.2 | −24.2 | −22.0 | −22.4 | −19.6 |
|  | (a* Value) + (b* Value) | Minimum | −14.5 | −21.4 | −24.3 | −24.6 | −11.2 |
|  |  | Maximum | 4.0 | −10.3 | −2.1 | −0.3 | 2.1 |
|  |  | Average | −5.4 | −16.2 | −13.3 | −13.5 | −5.5 |
|  | Collecting Efficiency | % | 99.89 | 99.91 | 99.92 | 99.05 | 99.87 |

As obvious from Table 1, Examples 1 to 4 all involved adjusting the water imparting conditions for the fiber sheet and thereby afforded an electret fiber sheet in which the averages of a* values and b* values satisfy: (a) 10≤average of (a* value)≤40; (b) −25≤average of (b* value)≤0; and (c) −5≤average of [(a* value)+(b* value)]≤40. In addition, the red toner was attached on the fiber sheet surface to be unevenly distributed, and this confirms that negative polarity charge was unevenly distributed to be denser toward the surface in the fiber sheet and exhibited high collecting efficiency.

In contrast, as obvious from Table 2, Comparative Examples 1 to 5 gave a* values and b* values which did not

The invention claimed is:

1. An electret fiber sheet wherein averages of a* values and b* values satisfy (a) to (c):

$$10 \leq \text{average of } (a^* \text{ values}) \leq 40; \quad (a)$$

$$-25 \leq \text{average of } (b^* \text{ values}) \leq 0; \text{ and} \quad (b)$$

$$-5 \leq \text{average of } [(a^* \text{ values}) + (b^* \text{ values})] \leq 40, \quad (c)$$

wherein a* and b* are values measured by a spectrophotometer when a red positive charge toner and a blue negative charge toner are attached.

2. The electret fiber sheet according to claim 1, wherein an a* value and a b* value satisfy (d) to (f):

$$5 \leq a^* \text{ value} \leq 50; \quad (d)$$

$$-30 \leq b^* \text{ value} \leq 5; \text{ and} \quad (e)$$

$$-10 \leq (a^* \text{ value}) + (b^* \text{ value}) \leq 50, \quad (f)$$

wherein a* and b* are values measured by a spectrophotometer when a red positive charge toner and a blue negative charge toner are attached.

* * * * *

UNITED STATES PATENT AND TRADEMARK OFFICE
CERTIFICATE OF CORRECTION

PATENT NO. : 10,512,861 B2
APPLICATION NO. : 16/062168
DATED : December 24, 2019
INVENTOR(S) : Iyama et al.

Page 1 of 1

It is certified that error appears in the above-identified patent and that said Letters Patent is hereby corrected as shown below:

In the Specification

In Column 4
Line 19, please change "poly-condensate" to --polycondensate--.

In Column 4
Line 20, please change "tetrameth-ylpiperidine" to --tetramethylpiperidine--.

In Column 4
Line 27, please change "tetramethylbut-yl" to --tetramethylbutyl--.

In Column 6
Line 23, please change "0.1 to 8.0" to --0.1 to 8.0 μm--.

In Column 9
Line 32, please change "CHIMAS SORB" to --CHIMASSORB--.

Signed and Sealed this
Twenty-first Day of July, 2020

Andrei Iancu
*Director of the United States Patent and Trademark Office*